(12) United States Patent
Kaiserman et al.

(10) Patent No.: US 6,641,860 B1
(45) Date of Patent: Nov. 4, 2003

(54) METHOD OF MANUFACTURING PRINTED CIRCUIT BOARDS

(75) Inventors: Terrance Z. Kaiserman, Loxahatchee, FL (US); Keith J. Margolin, Caldwell, NJ (US)

(73) Assignee: T-Ink, L.L.C., New York, NY (US)

( * ) Notice: Subject to any disclaimer, the term of this patent is extended or adjusted under 35 U.S.C. 154(b) by 176 days.

(21) Appl. No.: 09/753,849

(22) Filed: Jan. 3, 2001

Related U.S. Application Data

(60) Provisional application No. 60/174,298, filed on Jan. 3, 2000.

(51) Int. Cl.[7] .............................. B05D 5/12; B05D 3/10
(52) U.S. Cl. ...................... 427/96; 427/123; 427/189; 427/190; 427/191; 427/194
(58) Field of Search ................... 427/189–194, 427/198, 96, 123, 355, 369, 286, 287, 288

(56) References Cited

U.S. PATENT DOCUMENTS

| | | | |
|---|---|---|---|
| 515,778 A | 3/1894 | Lemp | 219/57 |
| 3,834,301 A | 9/1974 | Croquelois | 101/1 |
| 3,913,219 A | 10/1975 | Lichtblau | 29/592 |
| 4,234,626 A | * 11/1980 | Peiffer | 427/97 |
| 4,327,124 A | * 4/1982 | DesMarais, Jr. | 427/96 |
| 4,539,747 A | 9/1985 | Stein | 29/846 |
| 4,896,598 A | 1/1990 | Leech, Jr. | 101/170 |
| 5,127,330 A | 7/1992 | Okazaki | 101/450.1 |
| 5,151,386 A | 9/1992 | Bottari | 437/187 |
| 5,201,268 A | 4/1993 | Yamamoto | 101/170 |
| 5,219,007 A | 6/1993 | Ebbing | 141/7 |
| 5,256,442 A | 10/1993 | Kawakami | 427/96 |
| 5,286,713 A | 2/1994 | Yokoyama | 505/1 |
| 5,304,392 A | 4/1994 | Matsumoto | 427/96 |
| 5,314,711 A | 5/1994 | Baccini | 427/97 |
| 5,314,788 A | 5/1994 | Suzuki | 430/313 |
| 5,352,479 A | 10/1994 | Iida | 27/96 |
| 5,352,482 A | 10/1994 | Kondo | 427/96 |
| 5,358,604 A | 10/1994 | Lin | 156/664 |
| 5,362,513 A | 11/1994 | Shimada | 427/58 |
| 5,366,760 A | 11/1994 | Fujii | 427/96 |
| 5,371,029 A | 12/1994 | Abdo | 437/51 |
| 5,436,028 A | 7/1995 | Becher | 427/96 |
| 5,478,699 A | 12/1995 | Blessington | 430/308 |
| 5,480,839 A | 1/1996 | Ezawa | 437/209 |
| 5,499,731 A | 3/1996 | Marshall | 216/22 |
| 5,679,469 A | * 10/1997 | Shimoda et al. | 428/627 |
| 5,693,559 A | 12/1997 | Taniguchi | 437/183 |
| 5,702,653 A | 12/1997 | Riley | 264/61 |
| 5,716,663 A | 2/1998 | Capote | 427/96 |

* cited by examiner

*Primary Examiner*—Brian K. Talbot
(74) *Attorney, Agent, or Firm*—Lerner, David, Littenberg, Krumholz & Mentlik, LLP

(57) ABSTRACT

Methods of manufacturing printed circuit boards are disclosed. The methods utilize various printing techniques to apply conductive compositions to substrates in the creation of printed circuit boards. The method of manufacturing printed circuit board comprises the step of applying conductive composition to a substrate through a cold welding process.

15 Claims, 1 Drawing Sheet

METHOD OF MANUFACTURING PRINTED CIRCUIT BOARDS

This patent application claims priority from provisional patent application No. 60/174,298 filed on Jan. 3, 2000.

FIELD OF THE INVENTION

The present invention relates to printing of printed circuit boards. More particularly, the present invention relates to offset printing of printed circuit boards.

BACKGROUND OF THE INVENTION

Printed circuit boards have been manufactured by various techniques including chemical etching, polymer thick film deposition, screen printing and sputtering. Each of these methods have certain areas where they can be improved.

Drawbacks associated with chemical etching of printed circuit boards relate to the use of hazardous chemicals and long processing times during the manufacturing process. The disposal of spent chemicals is also of concern.

Polymer thick film is another method for manufacturing printed circuit boards including flexible membrane boards. While this method has been relatively successful, one drawback is that it does not produce as fine a line as chemical etching. Further, the use of a polymer thick film manufacturing method is generally limited to one ink at a time. It is also more labor intensive than various other methods.

The present invention overcomes the drawbacks of the foregoing manufacturing methods by providing a new manufacturing method which more efficiently produces improved printed circuit boards.

SUMMARY AND OBJECTS OF THE INVENTION

The present invention relates to a method of manufacturing printed circuit boards. A preferred method comprises providing a conductive composition and a substrate. The conductive composition may comprise a liquid vehicle and electrically conducive material suspended or dissolved in the liquid vehicle. The method also comprises the step of applying the conductive composition to the substrate through an offset lithography printing technique so that a desired printed circuit pattern is obtained on the substrate.

Preferably, the conductive composition is applied to the substrate under a pressure of at least about 4 psi. More preferably, the application pressure is between about 50 psi and 1000 psi. Even more preferably, the pressure may be between about 50–500 psi.

It is also preferable for the method of manufacturing printed circuit boards to comprise the step of applying conductive composition to a substrate through a cold welding process. As used herein, the concept of "cold welding" the conductive composition to the substrate comprises applying the conductive composition to the substrate under a sufficient pressure so that the conductive material is separated from the liquid vehicle of the conductive composition. At the same time, the conductive material is forced together to form a conductive trace pattern on the surface of the substrate.

In certain embodiments, the substrate may comprise a substantially nonabsorbent material. Such nonabsorbent materials may include, but are not limited to, polyester, Kapton, or the like. When a substantially nonabsorbent substrate is used, a cold weld process takes place where the vehicle (i.e., the liquid portion of the conductive composition) gets squeezed out and the conductive particles (such as nonprecious or precious metals) form together. The liquid vehicle would be supported on the surface of the substantially nonabsorbent substrate and would then evaporate from such surface.

In an environment where the substrate is relatively absorbent, the application of pressure during the cold welding process will force the liquid vehicle to more quickly become absorbed into the substrate itself, while certain amounts of the liquid vehicle would still evaporate. Examples of a nonabsorbent substrate include, but are not limited to, a fibrous substrate that may be made of a paper product or the like, and porous coating such as porous ink, etc. The application of a suitable pressure in this embodiment will also force the conductive particles together to form a continuous conductive trace pattern with suitable conductivity.

In accordance with a preferred aspect of the present invention, the method of manufacturing printed circuit boards comprises initially applying conductive composition to a substrate through a printing process and subsequently subjecting said conductive composition and said substrate to a predetermined pressure after the conductive composition has been applied to the surface of the substrate. The predetermined pressure is preferably at least about 4 psi. More preferably, the predetermined pressure is between about 50 psi–1000 psi. Even more preferably, the predetermined pressure may be between about 50 psi–500 psi.

As used herein, the term "printed circuit board" is intended to cover various types of flexible and nonflexible substrates onto which a conductive trace pattern is applied. In accordance with the preferred method of the present invention, at least a portion of the conductive trace pattern comprises conductive composition printed on the surface of the substrate. It should also be understood that as used herein, the term "printed circuit board" is intended to cover substrates having a printed circuit pattern arranged on the surface thereof either with or without active or inactive circuit components also secured to the substrate. Thus, the term "printed circuit board" is intended to cover what may be considered only a portion of a printed circuit board as conventionally understood. The term "printed circuit board" is also intended to cover complete printed circuit boards that have circuit components thereon as conventionally understood. It should also be understood that as used herein, the term "printed circuit board" is intended to cover various types of substrates having conductive material arranged thereon, such as membrane switches and other types of switch devices.

The method of manufacturing printed circuit boards in accordance with the present invention is intended to cover several embodiments including, but not limited to, applying conductive composition to the surface of a substrate where pressure is applied as the conductive composition itself is applied to the surface of the substrate. The method is also intended to cover an in-line pressure application system where the conductive composition is initially printed on the surface of a substrate and pressure is later applied as part of an in-line manufacturing process. In another embodiment, the method is intended to cover printing conductive composition on the surface of a substrate and applying pressure to the conductive composition and the substrate off-line (i.e., in a separate assembly remote from the printed circuit board manufacturing assembly). Examples of the three foregoing embodiments are shown in the following drawings that form part of this disclosure.

Conductive compositions, such as conductive inks can be printed through various techniques such as offset lithography, letterpress, gravure, flexography, and the like to obtain very fine circuits for printed circuit boards. Simple single layer circuits as well as multilayered circuits can be achieved using the offset or letter press process. The substrates on which the conductive compositions are printed, can be fed into an associated printing press by one or more sheets at a time, or as part of a continuous web where a roller feed mechanism is employed.

Various printing techniques may be employed. For example, the conductive composition may be printed on a substrate through gravure, flexography, lithography, letter press, hot stamping, offset printing, and other methods. Offset printing is one preferred method as it often results in a completed circuit board with very fine conductive lines which have smooth edges. Further offset printing can be used to produce half-tones with controlled dot gain.

Various existing offset ink formulations and other coating compositions that are modified to be conductive, can be used. For example, ultraviolet (UV) cured offset inks and other types of chemistry, depending upon the substrate being printed and the desired properties, can be used. Most any ink or other printable composition, modified to be printed via an offset press, letter press, gravure, flexo and/or coaters' can be used regardless of chemistry. The preferred embodiment is UV cured inks because they can be cured immediately after the conductive ink is applied, thus eliminating picking by the next blanket or offsetting onto the sheet stacked directly on top of the printed substrate. Existing sheet fed and web presses can be employed and the limitation to the width or length of the substrate is that of the machinery it is printed on. The substrates are carriers for the printed circuit board and can be of any known content.

Substrates can range from paper to various plastics and synthetics as well as laminates of various kinds. The substrates may have a pressure sensitive layer thus allowing it to be mounted onto other substrates such as fiberglass for traditional handling of the circuit including, but not limited to, drilling, soldering, die cutting and otherwise adhering or attaching discreet components to the circuit board.

Self substrates may be made by printing or coating various layers in the desired sequence, and printed onto a release liner, thermo degradable substrate, moisture degradable substrate or otherwise degradable thus making a self substrate. The printed layers may be peeled off from the substrate or otherwise detached from the substrate.

Conductive inks can be applied via an offset lithography, letterpress or a combination press or a fine line pressure sensitive or heat activated adhesive, can be printed, that can act as a contact adhesive so that when a conductive foil or dry film comes in contact with the printed surface by hot or cold laminating, it would pull off the conductive dry film thus giving a continuity to the conductive lines that are formed. Either way would be effective in making conductive circuits that can withstand a pre-engineered set of specification for resistance levels, adhesion characteristics, ultimate properties, size and shape, etc.

Line widths and spacing of the printed conductive compositions may vary from greater than that of traditional thick film printing to at least as fine as conductive lines obtained through a chemical etched process. Lines may also be printed many layers high, depending upon practicality and registration constraints. The improvement of high speed printing in register is a major advancement for multi-layer printing. For example, circuits 20 or more layers thick would be acceptable.

Some objects and advantages of the present method of manufacturing printed circuit boards is that it reduces the manufacturing cost from that of conventional printed circuit board production, reduces or eliminates environmental pollutants from the chemical etching circuit board process, prints smoother lines, prints less ink when desired, prints cleaner edges, and reduces production time. Other objects of this invention is to be able to print short and long runs, gang different circuit boards together in one run and change substrates that are being printed upon without incurring additional expense for set ups. The present method would also reduce ink usage and allow for high speed curing in-line. Splitting the ink fountain by having different inks being printed at the same time allows for the printing of different inks on the same plate being deposited on the same substrate at the same or different time. This can help in scheduling and reduce costs for set ups and plate costs.

Offset or letterpress printing would also allow for in line die cutting, depending on the machinery capabilities, so that the circuit is complete when finished as opposed to off line cutting of the circuits which increases handling and costs. Either method can be used in high speed manufacturing.

Another object of the invention is to reduce the cost of membranes as well and to give new capabilities for size and sensitivity. These membranes could be used as sensors for level sensing, potentiometers, motion sensors, temperature sensors, humidity sensors, pressure sensors, light sensors, barometric sensors, touch sensors, magnetic sensors, bend sensors, smoke sensors, sound sensors, circuit breakers, and various other uses.

Another object of the invention is to revolutionize and cut the cost of battery testers, produce inexpensive capacitors and resistors, reduce costs for magnets, antennas both sending and receiving, EMI shielding, heating elements, electrolumniscent lamps, batteries, and other rigid and flexible circuitry printed on Offset, letterpress, gravure, flexo and other printing and coating methods.

These and other objects, features and advantages of the present invention will best be appreciated when considered in view of the following detailed description of the preferred embodiments and accompanying drawings.

DETAILED DESCRIPTION OF THE PREFERRED EMBODIMENTS

Figure 1:
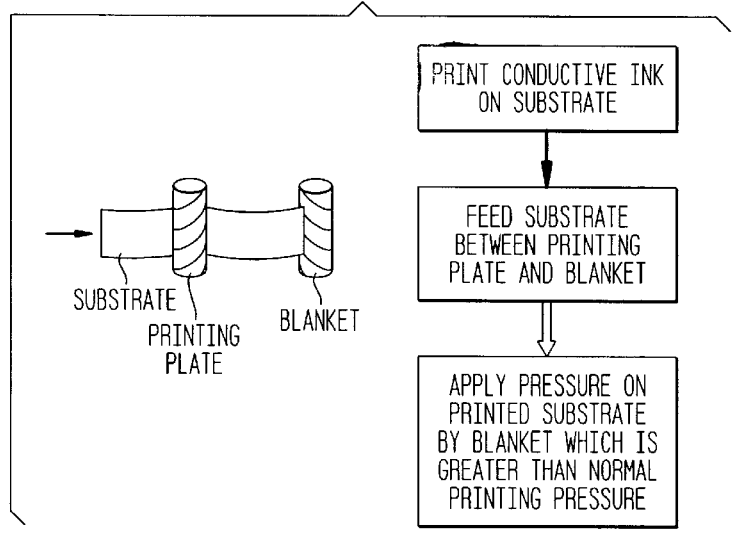
FIG. 1 is a schematic illustration depicting how a printed circuit board can be manufactured in accordance with the present invention where pressure is applied to a conductive composition printed on a substrate through an in-line production process.

A substrate is chosen dependent upon the end properties desired. These properties include, but are not limited to, flexibility, durability, flame retardency, coefficient of thermal expansion, moisture absorption, thickness, shape, etc.

The substrate can be cut from individual sheets or can be cut from a continuous web that is arranged on a roll for continuous printing. The substrate may comprise, but is not limited to, paper, plastics, laminates, non woven textiles, woven and knit textiles, other polymer types or any combination determined to be necessary to achieve ultimate properties. The substrate can be arranged in a single layer or multiple layers.

If paper or plastic is used, regardless of thickness or size, it may need a dielectric layer printed or coated on the paper to keep moisture, static and/or other unwanted elements from penetrating into the conductive inks used for the circuit board or membrane. This coating may also be used to enhance adhesion characteristics of the subsequent inks or coatings applied.

Offset printing can use a variety of plates and methods of development. All existing methods can be employed and all plate types can be used. Blanket types and fountain solutions may vary from press to press, however, all existing types can be used.

The type of printing equipment is not critical and most existing presses including one color presses can be used. A preferred embodiment may utilize a press with multiple printing heads. For example, an eight color offset press has been used with favorable results. The press can be fitted with UV curing lamps in between print heads. Infrared (IR) heaters can also be used in between stations or at a specific location on the press. Circulating hot air may also be used by itself or in combination with other heating methods.

Static eliminators of various types may be used to reduce or eliminate static from the substrate. Similarly, various treatments to the substrate in order to enhance printability or performance, on or off press, may be employed. Spray powders may be used to prevent multiple substrate sheets from sticking to one another.

In an embodiment where a sheet-fed press is used, production speeds of about 9,000 sheets per hour have been obtained. In an alternate embodiment where a roll-fed press is used, the substrate can be a continuous web of material fed through a production machine at speeds of at least 100 feet/min. and preferably between about 100 feet/min.–500 feet/min.

Inks can be of all known types can be modified to be conductive and used with the present methods. Inks can also be used as insulators. Inks can be used to dissipate heat, eliminate static, adjust dielectric constants and act as sensors. Inks used may be modified to increase scratch or abrasion resistance, adjust gloss levels. The inks include pigments and dyes of various types including optical brightners, phosphorescence and thermochromic. The inclusion of pigments or coloring matter may be used for visual inspection for coverage, heat dissipation, light emissions and UV flourescing for high speed inspection by visual means or mechanical means including camera and IR inspection.

Temperature and humidity conditions may vary but are best at standard paper printing environmental conditions.

The substrate, after printing may be protected to eliminate contamination. The substrate may also be die cut by all conventional means or may be guillotine cut or slit in-line or off-line. Various conventional bindery equipment may be employed if the substrate is to be fabricated into an item such a book or throw away circuit.

With reference to FIG. 1, the substrate may comprise paper having a moisture barrier layer printed thereon. The amount of print passes or coating passes for the moisture barrier is determined by the ultimate barrier properties desired. Single or multiple passes may be employed. Printed over the moisture barrier layer, is the first conductive lines. These conductive lines may be printed using various conductors including but not limited to, carbon black, graphite, precious metals, conductive non-precious metals, conductive polymers, etc. Depending upon the desired conductivity, one layer of conductive ink may be adequate. If one layer is not adequate, the same design, either using multiple offset plates of exactly the same design or running the substrate back through a one color press for example multiple times, may be employed.

In most cases, each time conductive ink is applied over the same spot, the thickness of the conductive layer increases and the resistance decreases until an equilibrium is reached. This equilibrium is determined by getting the lowest resistance from that particular conductive ink after a given number of print or coating passes. When the conductivity does not substantially change with the addition of a conductive ink layer, it is impractical to apply more of the same conductive ink. In such a situation, if it is desired to further increase conductivity (i.e., to lower resistance), another conductive ink either used alone or used in conjunction with the first ink, may be employed.

Any color ink may be used in order to identify a particular circuit or to create a desired pattern or design. Other types of printing and designs may be used for decorative or instructional purposes.

Where the substrate is in sheet form, as opposed to a continuous roll, the sheets may be die cut or slit on press or off. Multiple copies of the same design can be printed on one sheet, and would then need to be separated. For example, if a printed circuit design encompasses 1 square inch, approximately 950 designs can be printed on a 25 inch×38 inch sheet. Sheets may be designed to include numerous printed circuit designs to facilitate the printing of multiple orders at one time. Resistance levels may vary on different. parts of the sheet by either changing conductive ink types or varying the geometry of the pattern with the same conductive inks being used.

The printing of multiple circuits on a single sheet reduces the non-productive times. These non-productive times include, set ups, wash ups, registration procedures, etc. It is better to make one set of offset plates that has two designs than two sets of plates. With two sets of plates there is additional stripping and preparation costs, additional plate charges and twice the non productive time on the press. This increases the cost on a linear basis to double versus one set of charges.

Figure 2:
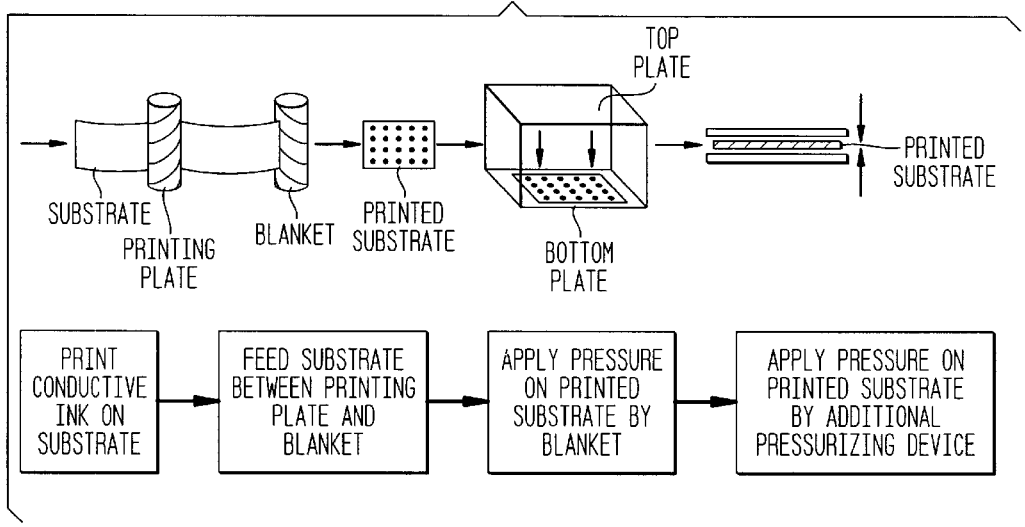
FIG. 2 is another schematic illustration depicting how a printed circuit board can be manufactured in accordance with the present invention where pressure is applied to a conductive composition after it has been applied to the surface of the substrate through either an in-line or off-line process.

With regard to FIG. 2, another is example is shown. The substrate may be a plastic or synthetic that does not require a moisture barrier layer. It may or may not need a primer coat to enhance adhesion of the inks to the substrate or a corona treatment or the like to make the surface more ink receptive.

Numerous layers of conductor and resistor circuits can be printed, depending upon the design requirements. As in Example #1, numerous passes may be made of each and every ink being printed until the desired requirement is obtained. Circuit boards and membranes can be done the same way.

Figure 3:
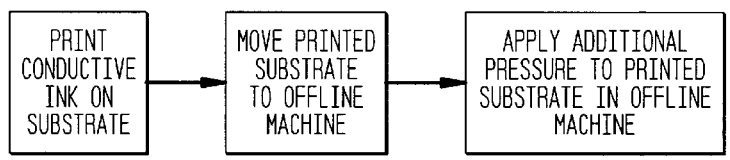
FIG. 3 is another schematic illustration depicting how a printed circuit board can be manufactured in accordance with the present invention where pressure is applied to a conductive composition after it has been applied to the surface of the substrate through an off-line process.

A third example is illustrated in FIG. 3. The substrate may be a plastic sheet, or other material, that has both halves of a membrane printed on it. The ink deposit may be relatively minimal on both sides. The substrate can be folded in half to form spaced layers which form a membrane with very small spacing between each layer. A gas can be pumped, which can be air, into the partially sealed membrane to add additional spacing and tactile feel to the membrane and then the membrane is sealed. When the outside of the membrane is depressed, the gas is displaced and the two layers come into contact to trigger a circuit. As long as there is some air pressure, due to the low deposition of ink on both sides, the micro spacing can be uncompromised. This allows a membrane to be a function as any one of various sensors such as a pressure sensor, barometric sensor or a temperature sensor.

In the above listed examples, the product may be finished by laminating spacers and top conductive layers to one another to complete the fabrication of a printed circuit board. The circuit board could be finished by having a conformal layer applied either on or off the printing press. All finishing steps can be used to utilize or protect the printed circuit board.

Various finishing techniques can be employed at this point including, but not limited to, die cutting, drilling, stamping and the like. Typical connectors may be attached by conventional methods.

Although the invention herein has been described with reference to particular methods and embodiments, it is to be understood that these methods and embodiments are merely illustrative of the principles and applications of the present invention. It is therefore to be understood that numerous modifications may be made to the described methods and embodiments and that other arrangements may be devised without departing from the spirit and scope of the present invention as defined by the following claims.

We claim:

1. A method of manufacturing printed circuit boards comprising:

providing a conductive composition including a liquid vehicle and electrically conductive material therein;

providing a substrate;

applying said conductive composition to said substrate by cold welding said conductive composition to said substrate whereby sufficient pressure is applied to said conductive composition such that said conductive material is separated from said liquid vehicle and said conductive material is forced together so that a desired printed circuit pattern is obtained on said substrate.

2. The method of claim 1 wherein said conductive composition is applied to said substrate under pressure of at least about 4 psi.

3. The method of claim 2 wherein said pressure is between about 50–1000 psi.

4. The method of claim 1 wherein said substrate is substantially nonconductive, said conductive composition comprises conductive material and a liquid vehicle, said conductive material being forced together during said cold welding process and said liquid vehicle being retained on the surface of said substrate until it evaporates therefrom.

5. The method of claim 1 wherein said cold welding step is part of an offset lithography process.

6. The method of claim 1 wherein said cold welding step is part of a dry offset printing process.

7. The method of claim 1 wherein said cold welding step is part of a letter press printing process.

8. The method of claim 1 wherein said cold welding step is part of a gravure printing process.

9. The method of claim 1 wherein said cold welding step is part of a flexographic printing process.

10. A method of manufacturing printed circuit boards comprising:

providing a conductive composition including a liquid vehicle and electrically conductive material therein;

providing a substrate;

initially applying said conductive composition, to said substrate; and subjecting said conductive composition and said substrate to a cold welding process after said conductive composition has been applied to the surface of said substrate whereby sufficient pressure is applied to said conductive composition such that said conductive material is separated from said liquid vehicle and said conductive material is forced together to form a conductive trace on the surface of said substrate.

11. The method of claim 10 wherein said predetermined pressure is at least about 4 psi.

12. The method of claim 11 wherein said predetermined pressure is between about 50 psi–1000 psi.

13. The method of claim 12 wherein said predetermined pressure is between about 50 psi–500 psi.

14. The method of claim 10 wherein said predetermined pressure is applied through an in line process.

15. The method of claim 10 wherein said predetermined pressure is applied through an off line process where the printed circuit board with the conductive composition applied is placed in a separate pressurizing assembly.

* * * * *